(12) United States Patent
Tagami et al.

(10) Patent No.: US 6,249,160 B1
(45) Date of Patent: Jun. 19, 2001

(54) CLOCK REPRODUCTION AND IDENTIFICATION APPARATUS

(75) Inventors: Hitoyuki Tagami; Kuniaki Motoshima, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/376,496

(22) Filed: Aug. 18, 1999

(30) Foreign Application Priority Data

Dec. 3, 1998 (JP) .................................. 10-343790
Apr. 28, 1999 (JP) .................................. 11-121214

(51) Int. Cl.$^7$ .................................................. H03K 5/01
(52) U.S. Cl. .......................... 327/165; 327/166; 327/156
(58) Field of Search .................... 326/93; 327/2, 327/141, 165, 166, 262, 276, 291, 299, 392, 393

(56) References Cited

U.S. PATENT DOCUMENTS

| 4,320,515 | * | 3/1982 | Burton, Jr. ........................... 327/156 |
| 4,949,051 | * | 8/1990 | Viola .................................... 327/165 |
| 5,124,669 | * | 6/1992 | Palmer et al. ....................... 327/227 |
| 5,164,966 | * | 11/1992 | Hershberger ......................... 327/165 |
| 5,483,180 | * | 1/1996 | Chai et al. ............................. 326/93 |
| 5,671,259 | * | 9/1997 | Thomas et al. ....................... 327/165 |

OTHER PUBLICATIONS

M. Soda et al, Proceedings of Electronics Society Conference of IEICE, C–12–44, in 1998.

Keiji Kishine et al, Proceedings of Electronics Society Conference of IEICE, B–10–141, in 1997.

M. Akashi et al, Proceedings of Electronics Society Conference of IEICE, C–12–61, in 1998.

* cited by examiner

*Primary Examiner*—Kenneth B. Wells
*Assistant Examiner*—Paul Dinh

(57) ABSTRACT

In a clock reproduction and identification device, a clock extraction circuit extracts a transmission line clock from input data and a phase synchronization section reproduces an identification clock synchronized with the transmission line clock in frequency and phase. An identification section identifies the input data based on the identification clock.

20 Claims, 16 Drawing Sheets

CLOCK REPRODUCTION AND IDENTIFICATION APPARATUS

BACKGROUND OF THE INVENTION

1. Field of the Invention

This invention relates to a clock reproduction and identification apparatus for reproducing an identification clock from a data signal and identifying input data.

2. Description of the Related Art

FIG. 14 shows a clock reproduction and identification apparatus in a related art shown in "Proceedings of Electronics Society Conference of IEICE", C-12-44 in 1998, for example.

The configuration and operation of the clock reproduction and identification apparatus in the related art will be discussed.

Here, phase synchronization means 1 is made up of a phase comparison circuit 2, an integration circuit 3, and a voltage-controlled oscillation circuit (VCO). The phase comparison circuit 2 is a logic circuit having a phase comparison characteristic as shown in FIG. 15. That is, assuming that the transmission line clock cycle is $2\pi$, when the phase difference between input data and an identification clock output by the VCO 4, $\phi$, is $-\pi<\phi<0$, logic high is output; when the phase difference $\phi$ is $0<\phi<\pi$, logic low is output.

When $\phi=0$, a mid-point potential of logic high and logic low is output. The integration circuit 3 is a low-pass filter having a sufficiently long time constant relative to the transmission line clock cycle. Further, the VCO 4 has a control voltage vs oscillation frequency characteristic as shown in FIG. 16.

FIG. 17A is a timing chart applied when the identification clock phase leads. The phase comparison circuit 2 compares an input data change point with the falling timing of the identification clock and outputs logic high. The integration circuit 3 integrates output of the phase comparison circuit 2 with a sufficiently large time constant relative to the transmission line clock cycle, and output gradually makes a transition to logic high. Output of the integration circuit 3 is input as control voltage of the VCO 4, and oscillation frequency decreases. Therefore, the phase difference $\phi$ decreases in the direction in which the input data change point matches the falling timing of the identification clock.

FIG. 17B is a timing chart applied when the identification clock phase lags. The phase comparison circuit 2 outputs logic low and output of the integration circuit 3 gradually makes a transition to logic low. The oscillation frequency of the VCO 4 increases, and the phase difference $\phi$ decreases in the direction in which the input data change point matches the falling timing of the identification clock.

FIG. 17C is a timing chart in a synchronization state in which the input data signal change point matches the falling timing of the identification clock. The phase comparison circuit 2 outputs a mid-point potential of logic high and logic low and the integration circuit 3 also outputs a mid-point potential of logic high and logic low. The oscillation frequency of the VCO 4 is fixed, and the synchronization state in which the input data change point matches the falling timing of the identification clock is maintained. Assuming that the phase comparison circuit 2 has an infinite gain in the synchronization state, output becomes undefined between logic high and logic low because of jitter contained in the input data signal and the identification clock. However, in optical communication apparatuss, etc., generally the data signal is scrambled and the mark rate is 0.5, thus output of the integration circuit 3 becomes a mid-point potential of logic high and logic low.

Thus, the phase synchronization means 1 converges on the synchronization state in which the input data change point matches the falling timing of the identification clock. Identification means 5 can identify and reproduce the data signal in the optimum identification phase for input data by identifying the input data on the rising edge of the identification clock.

The operation of the phase synchronization means 1 has been described with reference to FIGS. 17A to 17C by assuming that the duty of input data is 100% (the duty means the time percentage from the rising edge to the falling edge to the transmission line clock cycle) In fact, however, the duty of input data may change due to waveform distortion of an equalization amplifier, etc., connected to the preceding stage.

FIGS. 18A to 18C are timing charts of the phase synchronization means 1 applied when input data contains distortion. In the description to follow, assume that input data contains distortion such that the logical high time becomes longer than the logical low time.

FIG. 18A is a timing chart applied when the rising edge of input data matches the falling phase of the identification clock. At the rising change point of the input data, the rising edge of input data matches the falling edge of the identification clock in phase, thus the phase comparison circuit 2 outputs a mid-point potential. At the falling change point of the input data, the falling phase of the identification clock leads, thus the phase comparison circuit 2 outputs logic high. Output of integration circuit 3 makes a transition to logic high and the oscillation frequency of the VCO 4 decreases. Therefore, the phase difference $\phi$ shifts in the direction in which the falling change point of the input data matches the falling timing of the identification clock.

FIG. 18B is a timing chart applied when the falling edge of input data matches the falling phase of the identification clock. At the rising change point of the input data, the falling phase of the identification clock lags, thus the phase comparison circuit 2 outputs logical low. At the falling change point of the input data, the falling edge of the input data matches the falling edge of the identification clock in phase, thus the phase comparison circuit 2 outputs a mid-point potential. Output of integration circuit 3 makes a transition to logic low and the oscillation frequency of the VCO 4 increases. Therefore, the phase difference $\phi$ shifts in the direction in which the rising change point of the input data matches the falling timing of the identification clock.

FIG. 18C is a timing chart applied when the center of input data matches the rising phase of the identification clock. The phase is an intermediate phase state of the phases shown in FIGS. A and B. At the rising change point of the input data, the falling phase of the identification clock lags, thus the phase comparison circuit 2 outputs logical low.

At the falling change point of the input data, the falling phase of the identification clock leads, thus the phase comparison circuit 2 outputs logic high. Since distortion of the input data is that the logical high time is longer than the logical low time, output of integration circuit 3 makes a transition to logic low and the oscillation frequency of the VCO 4 increases. Therefore, the phase difference $\phi$ shifts in the direction in which the rising change point of the input data matches the falling timing of the identification clock.

As described above, when the input data contains distortion, the phase synchronization means 1 does not involve a stable phase synchronization state as shown in FIG. 17C. For input data distortion such that the logical high time becomes longer than the logical low time, the phase state makes a transition between FIGS. 18A and 18C. The phase transition becomes jitter in the identification clock output as a clock signal and the data signal identified by the identification means 5 and substantially lessens a phase margin in the identification means 5. This is a problem in the clock reproduction and identification apparatus in the related art.

The operation of the phase synchronization means 1 has been described with reference to FIGS. 17A to 17C by assuming that the input data is a "1, 0" pattern repetition signal and that the above-described phase synchronization loop functions for always synchronizing phases with each other at each change point of the input data. However, the actual input data is a random transmission signal and the same long code may be received consecutively. International Standardization Committee ITU-T G.958 requires that input data containing the same continuous 72-bit code should be able to be reproduced accurately.

When the same code is received consecutively, the input data does not contain any change point, thus the phase comparison circuit 2 does not operate and the phase synchronization loop contained in the phase synchronization means 1 does not function. Generally, the integration circuit 3 charges output of the phase comparison circuit 2 in a capacitor, thereby accomplishing the integration function. Thus, if input data containing the same long continuous code is received, charges required for continuing phase synchronization are not supplied and the capacitor is discharged. The oscillation frequency of the VCO 4 increases accordingly and the apparatus is placed out of phase synchronization state. This is another problem in the clock reproduction and identification apparatus in the related art.

SUMMARY OF THE INVENTION

The present invention has been made to solve the above problems with the prior art, and therefore an object of the invention is to provide a clock reproduction and identification apparatus which is capable of synchronizing the phase of the identification clock with that of the transmission line clock with no distortion so that a stable phase synchronization state with no jitter can be provided and also if the input data containing the same long continuous code is received, the frequency tuner continues to output the transmission line clock so that phase synchronization can be held.

According to a first aspect of the invention, there is provided a clock reproduction and identification apparatus comprising clock extraction means for extracting a transmission line clock from input data, phase synchronization means for reproducing an identification clock synchronized with the transmission line clock in frequency and phase, and identification means for identifying the input data based on the identification clock.

In the clock reproduction and identification apparatus according to a second aspect of the invention, the clock extraction means comprises a change point detector for detecting a change point of the input data and a frequency tuner having a passage characteristic in a predetermined frequency band for extracting the transmission line clock.

In the clock reproduction and identification apparatus according to a third aspect of the invention, the identification means comprises a data delay device for giving a defined delay time to the input data and an identification device for identifying output of the data delay device based on the identification clock.

In the clock reproduction and identification apparatus according to a fourth aspect of the invention, the identification means comprises a clock delay device for giving a defined delay time to the identification clock and an identification device for identifying the input data based on output of the clock delay device.

In the clock reproduction and identification apparatus according to a fifth aspect of the invention, the data delay device comprises:
 a variable delay circuit for giving a delay time defined by a control signal;
 a phase comparison circuit for giving a phase difference signal responsive to the phase difference between output of the variable delay circuit and the identification clock; and
 an integration circuit for integrating output of the phase comparison circuit for providing the control signal.

In the clock reproduction and identification apparatus according to a sixth aspect of the invention, the clock delay device comprises:
 a variable delay circuit for giving a delay time defined by a control signal;
 a phase comparison circuit for giving a phase difference signal responsive to the phase difference between output of the variable delay circuit and the input data; and
 an integration circuit for integrating output of the phase comparison circuit for providing the control signal.

The clock reproduction and identification apparatus according to a seventh aspect of the invention further includes a second variable delay circuit for giving a delay time defined by a control signal, wherein
 the input data is given via the second variable delay circuit to the variable delay circuit.

The clock reproduction and identification apparatus according to an eighth aspect of the invention further includes a second variable delay circuit for giving a delay time defined by a control signal, wherein
 the input data is given via the second variable delay circuit to the clock extraction means.

The clock reproduction and identification apparatus according to a ninth aspect of the invention further includes a second variable delay circuit for giving a delay time defined by a control signal, wherein
 the identification clock is given via the second variable delay circuit to the identification means.

The clock reproduction and identification apparatus according to a tenth aspect of the invention further includes a second variable delay circuit for giving a delay time defined by a control signal, wherein
 the input data is given via the second variable delay circuit to the variable delay circuit.

The clock reproduction and identification apparatus according to an eleventh aspect of the invention further includes a second variable delay circuit for giving a delay time defined by a control signal, wherein
 the input data is given via the second variable delay circuit to the clock extraction means.

The clock reproduction and identification apparatus according to a twelfth aspect of the invention further includes a second variable delay circuit for giving a delay time defined by a control signal, wherein
 the identification clock is given via the second variable delay circuit to the identification means.

DETAILED DESCRIPTION OF THE PREFERRED EMBODIMENTS

Now, a description will be given in more detail of preferred embodiments of the invention with reference to the accompanying drawings.

First Embodiment

Figure 1:
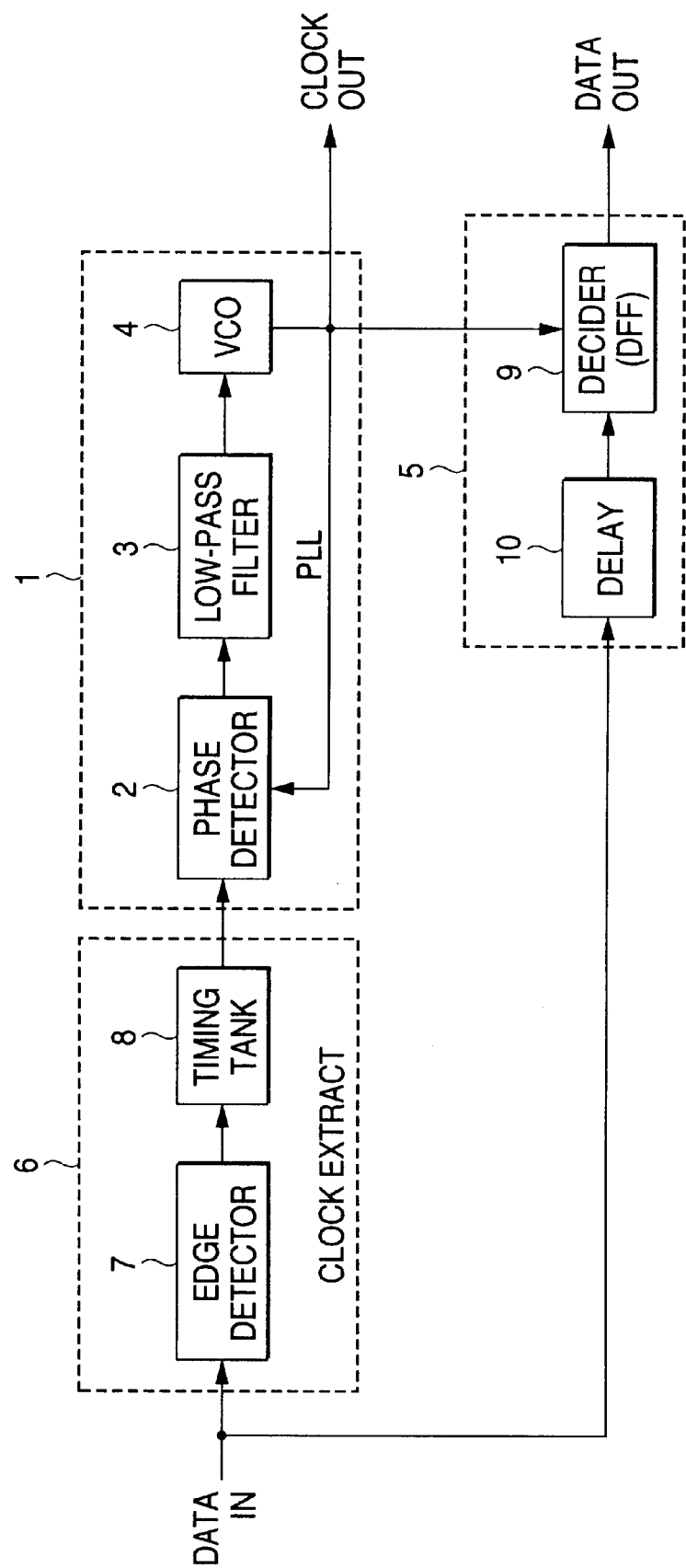
FIG. 1 is a block diagram of a clock reproduction and identification apparatus according to a first embodiment of the invention.

FIG. 1 is a block diagram of a clock reproduction and identification apparatus according to a first embodiment of the invention.

In FIG. 1, numeral 6 denotes clock extraction means having a function of extracting a transmission line clock from input data. Numeral 1 denotes phase synchronization means having a function of generating an identification clock synchronized with the transmission line clock in phase. Numeral 5 denotes identification means having a function of identifying the input data in an optimum phase state.

Figure 2:
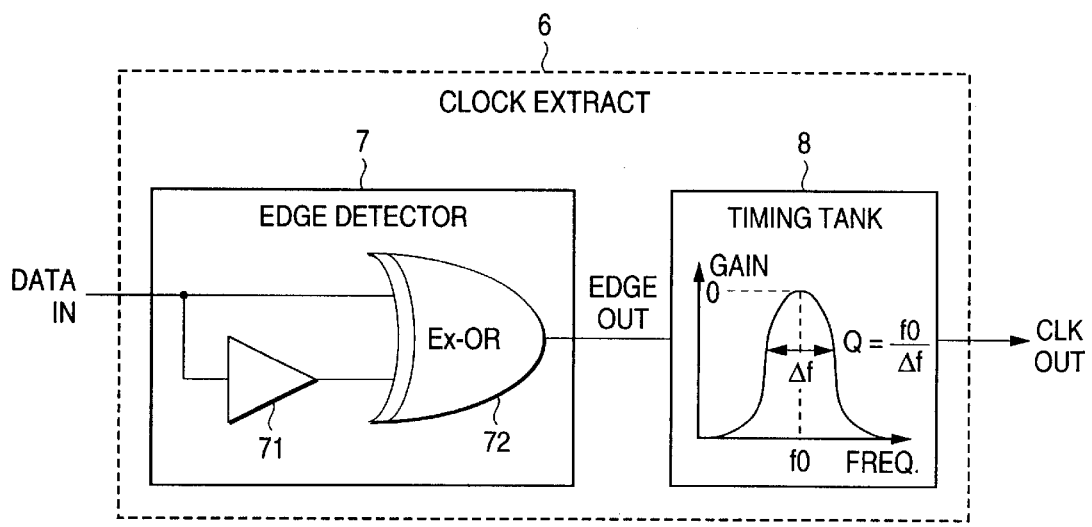
FIG. 2 is a block diagram of clock extraction means in the first embodiment of the invention.
Figure 3:
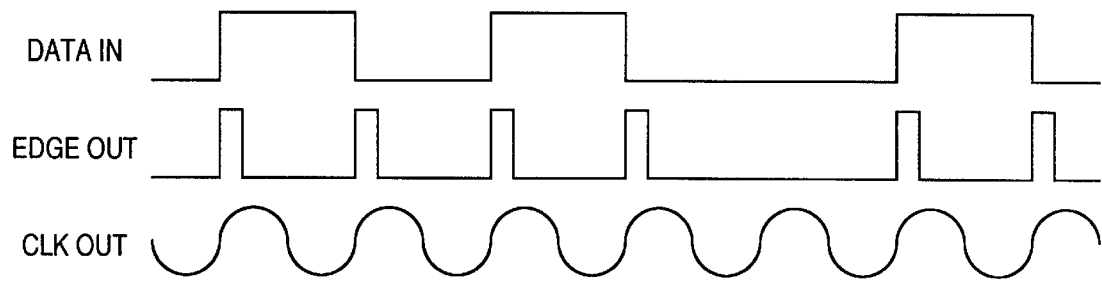
FIG. 3 is a timing chart of the clock extraction means in the first embodiment of the invention.

FIG. 2 is a detailed structure diagram of the clock extraction means 6 shown in FIG. 1. FIG. 3 is a timing chart of the clock extraction means 6 shown in FIG. 2.

The clock extraction means 6 is made up of a change point detector 7 and a frequency tuner 8, and the change point detector 7 is made up of a delay circuit 71 and exclusive-OR 72. Input data and input data given a predetermined delay amount by the delay circuit 71 are input to the exclusive-OR 72, which then outputs a change point detection signal having a pulse width of the delay amount given by the delay circuit 71 at each change point of the input data.

The frequency tuner 8 is a band-pass filter/having a pass band of $\pm \Delta f/2$ centering on a preset transmission line clock frequency (f0), and Q value is given according to the following expression:

$$Q = f0/\Delta f \quad (1)$$

When the change point detection signal output by the exclusive-OR 72 is input to the frequency tuner 8, only the frequency component defined in the pass band of the frequency tuner 8 is selected from the frequency spectrum of the change point detection signal and is output.

The larger the Q value shown in expression (1), the purer is output of the transmission line clock frequency; the output of the frequency tuner 8 becomes the waveform of a sine wave having the transmission line clock frequency. The frequency tuner 8 allows only the frequencies in the proximity of the transmission line clock to pass through, thus the waveform of the sine wave of the frequency tuner 8 is not affected by distortion of the input data. Therefore, if the input data is distorted, a transmission line clock of duty 50% with no distortion is output.

If input data containing the same continuous code is given, the change point detector 7 does not output a signal in the same continuous code part. However, if it is assumed that the frequency tuner 8 has no loss, input signal energy is conserved and output and the frequency tuner 8 continues to output the transmission line clock even in the same continuous code part. The time during which the frequency tuner 8 continues to output the transmission line clock in the same continuous code part is roughly defined with the Q value. That is, the frequency tuner 8 with Q=about 10 would be able to continue to output the transmission line clock for the input data containing the same continuous 72-bit code defined in International Standardization Committee ITU-T G.958.

Figure 17A:
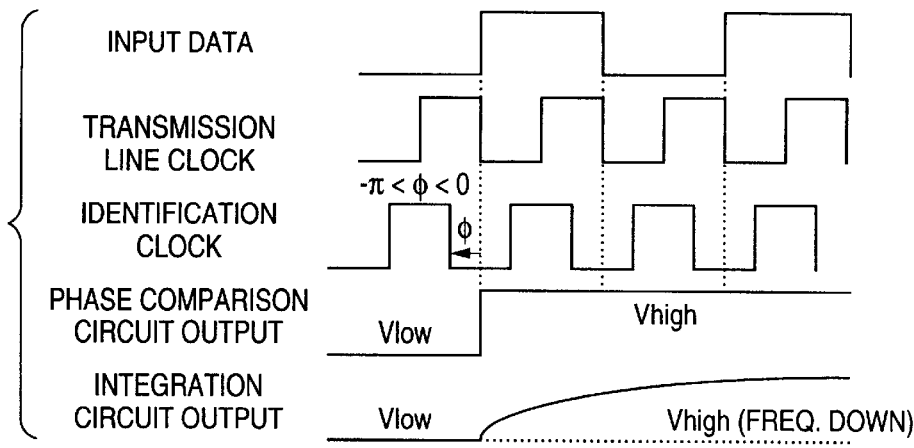
FIGS. 17A to 17C are timing charts to show identification clock phases in the related art.
Figure 17B:
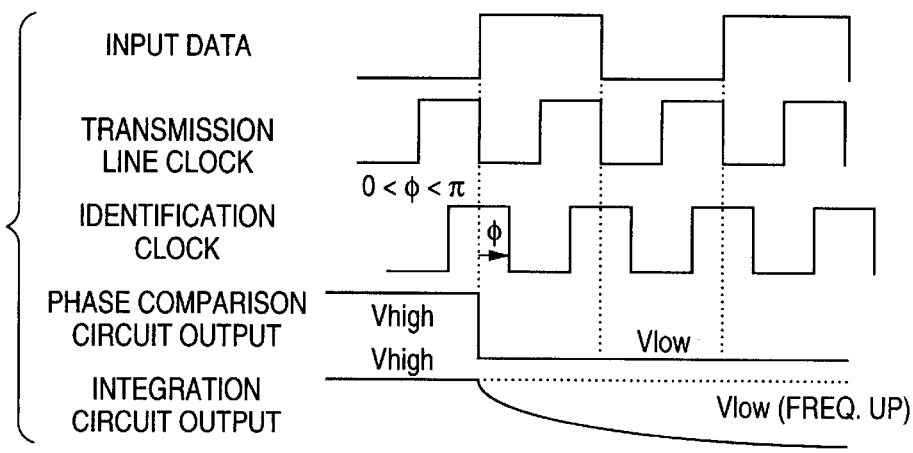
Figure 17C:
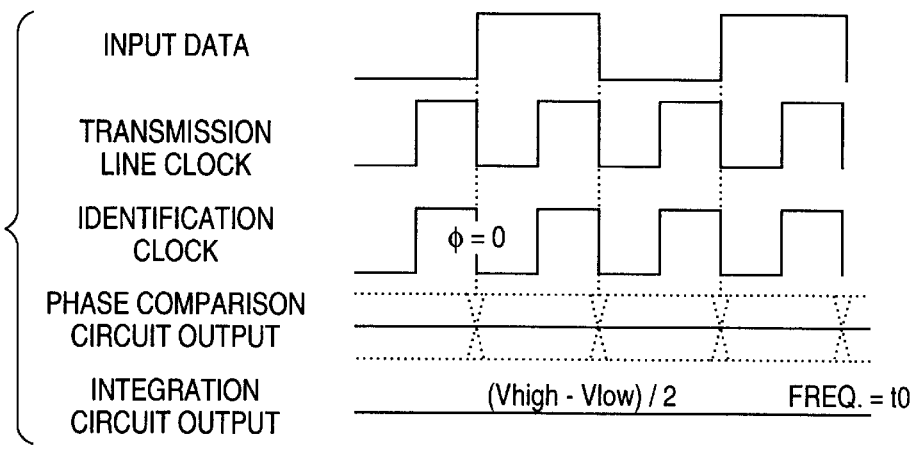

The phase synchronization means 1 is the same as the phase synchronization means 1 of the clock reproduction and identification apparatus in the related art except that the phase comparison circuit 2 detects a phase difference from an identification clock at the falling timing of a transmission line clock. The operation of the phase synchronization means 1 is the same as that previously described with reference to the timing charts of FIGS. 17A to 17C, wherein the transmission line clock is also shown. The phase synchronization means 1 operates as that of the clock reproduction and identification apparatus in the related art described above, namely, operates so that the falling edge of the transmission line clock matches the falling timing of the identification clock.

Since the phase synchronization means 1 operates so that the falling edge of the transmission line clock matches the falling timing of the identification clock, the input data and the identification clock have a phase error as much as the delay time in the clock extraction means 6. A data delay device 10 in the identification means 5 is provided for canceling the phase error of the input data and the identification clock, namely, delays the input data by as long as the delay time in the clock extraction means 6. The input data change point matches the falling timing of the identification clock and an identification device 9 identifies the input data on the rising edge of the identification clock, whereby the data signal can be identified and reproduced in the optimum identification phase for the input data.

Thus, if the input data contains distortion, the clock reproduction and identification apparatus shown in FIG. 1 synchronizes the phase of the identification clock with that of the transmission line clock with no distortion, so that a stable phase synchronization state with no jitter can be provided. If the input data containing the same long continuous code is received, the frequency tuner 8 continues to output the transmission line clock, so that phase synchronization can be held.

Second Embodiment

Figure 4:
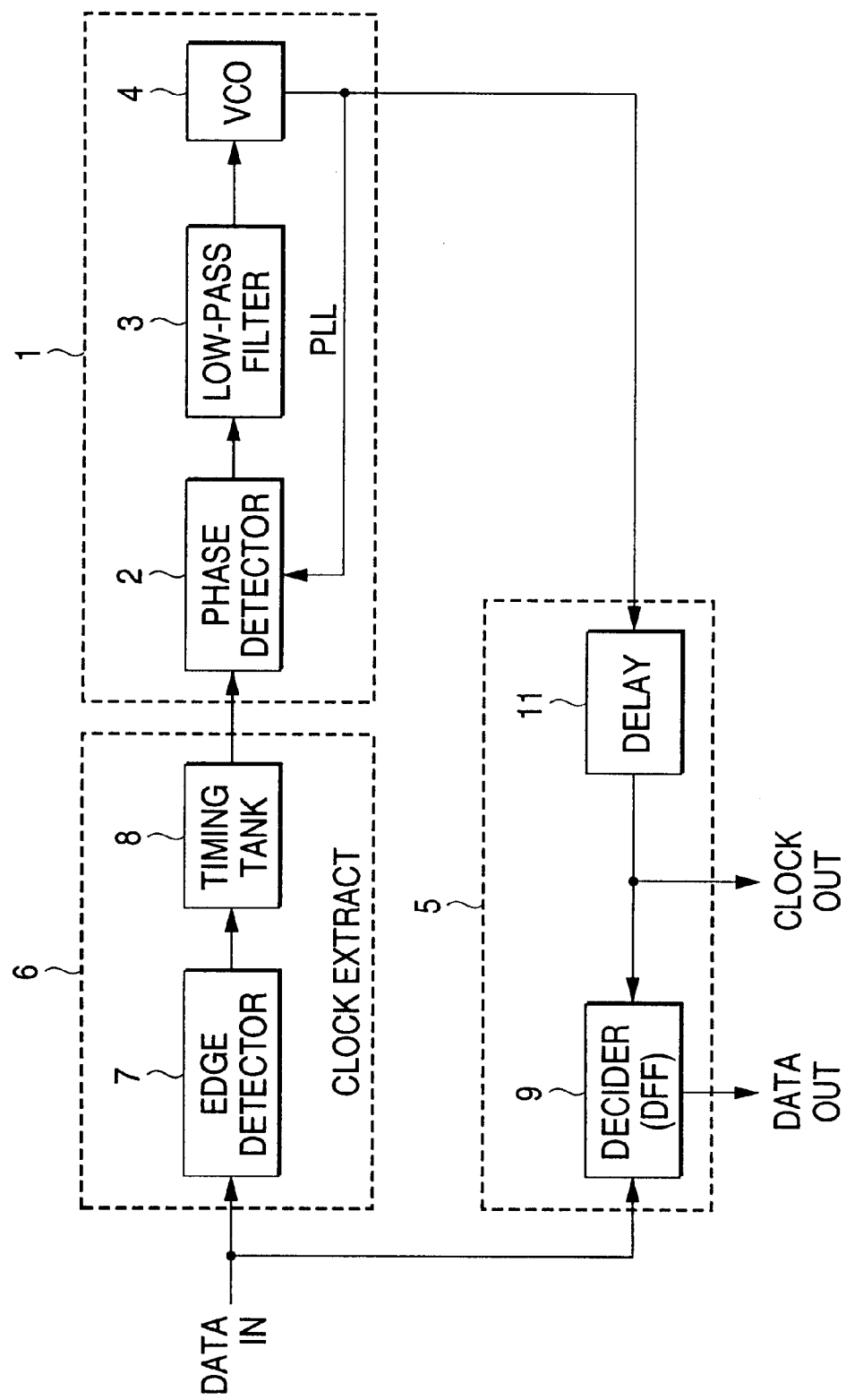
FIG. 4 is a block diagram of a clock reproduction and identification apparatus according to a second embodiment of the invention.

FIG. 4 is a block diagram of a clock reproduction and identification apparatus according to a second embodiment of the invention.

In FIG. 1, the identification means 5 is made up of the identification device 9 and the data delay device 10. The data delay device 10 delays input data by as long as the delay time in the clock extraction means 6 so that the change point of the input data matches the falling timing of the identification clock. Because of the voluntariness of data sequence, there is a possibility that the frequency spectrum of input data may contain the frequency components from DC component to frequency of a half the transmission line clock ("1, 0" data pattern). To prevent a data signal from being distorted in the data delay device 10, the data delay device 10 needs to have a flat passage characteristic in a wide frequency range.

The clock reproduction and identification apparatus in FIG. 4 differs from that in FIG. 1 in that identification means 5 is made up of an identification device 9 and a clock delay device 11. In FIG. 4, the clock delay device 11 gives a delay to an identification clock so that the input data change point matches the falling timing of the identification clock. If a delay is given to the identification clock for matching the input data change point and the falling timing of the identification clock with each other, the identification device 9 identifies input data on the rising edge of the identification clock, whereby the data signal can be identified and reproduced in the optimum identification phase for the input data.

The identification clock synchronizes with a transmission line clock in frequency and phase and thus contains only the frequency component in the proximity of the transmission line clock. The clock delay device 11 may have a flat passage characteristic in a frequency range in the proximity of the transmission line clock, facilitating the circuit configuration.

Clock extraction means 6 and phase synchronization means 1 are the same as that previously described with reference to FIGS. 1 to 3 in configuration and operation. Therefore, if input data contains distortion, the clock reproduction and identification apparatus in FIG. 4 synchronizes the phase of the identification clock with that of the transmission line clock with no distortion, so that a stable phase synchronization state with no jitter can be provided. If the input data containing the same long continuous code is received, a frequency tuner 8 continues to output the transmission line clock, so that phase synchronization can be held.

Third Embodiment

Figure 5:
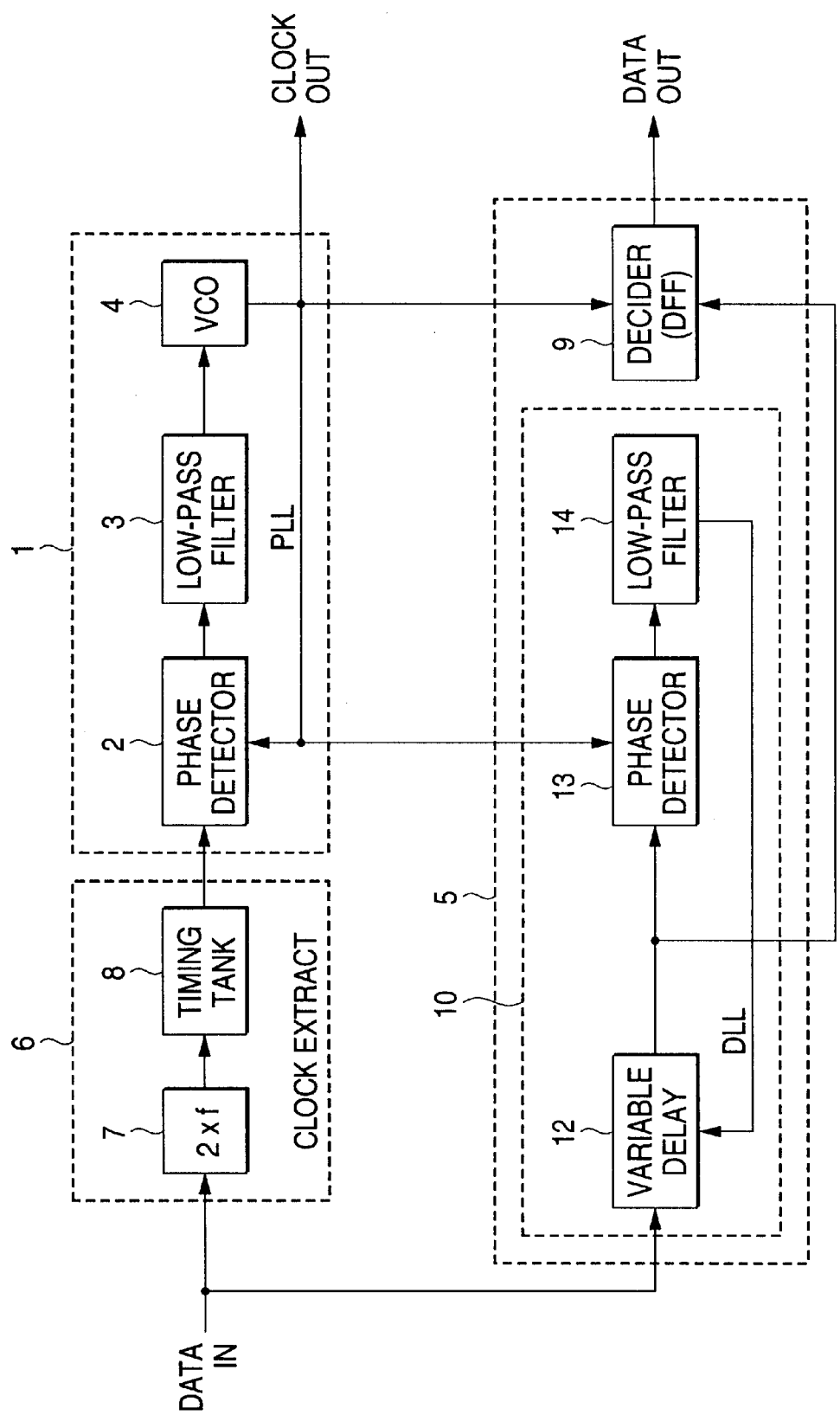
FIG. 5 is a block diagram of a clock reproduction and identification apparatus according to a third embodiment of the invention.

FIG. 5 is a block diagram of a clock reproduction and identification apparatus according to a third embodiment of the invention.

The clock reproduction and identification apparatus in FIG. 5 differs from that in FIG. 1 in that a data delay device 10 is made up of a variable delay circuit 12, a phase comparison circuit 13, and an integration circuit 14. The data delay device 10 in FIG. 1 involves a fixed delay device having the delay time in the clock extraction means 6. The data delay device 10 in FIG. 5 is provided for automatically controlling the delay time of input data so that the change point of the input data to an identification device 9 matches the falling timing of the identification clock.

Figure 14:
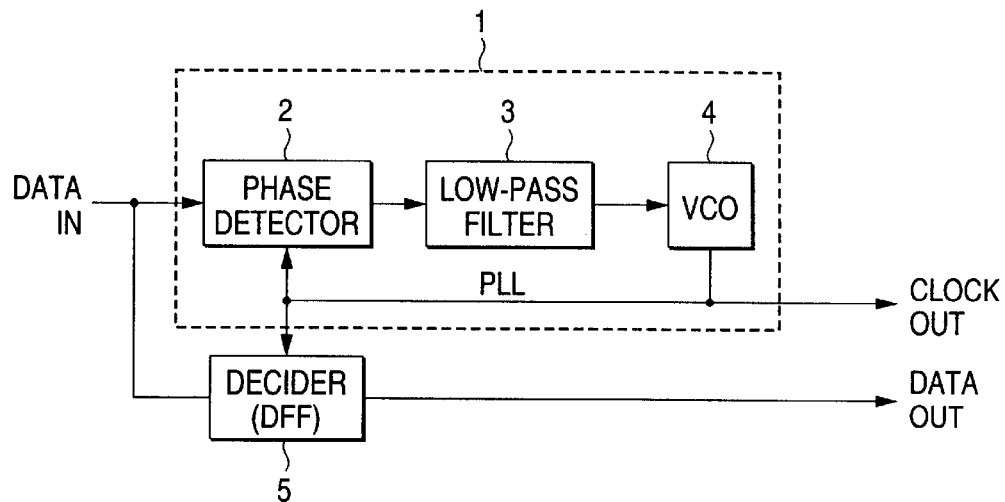
FIG. 14 is a block diagram of a clock reproduction and identification apparatus in a related art.
Figure 15:
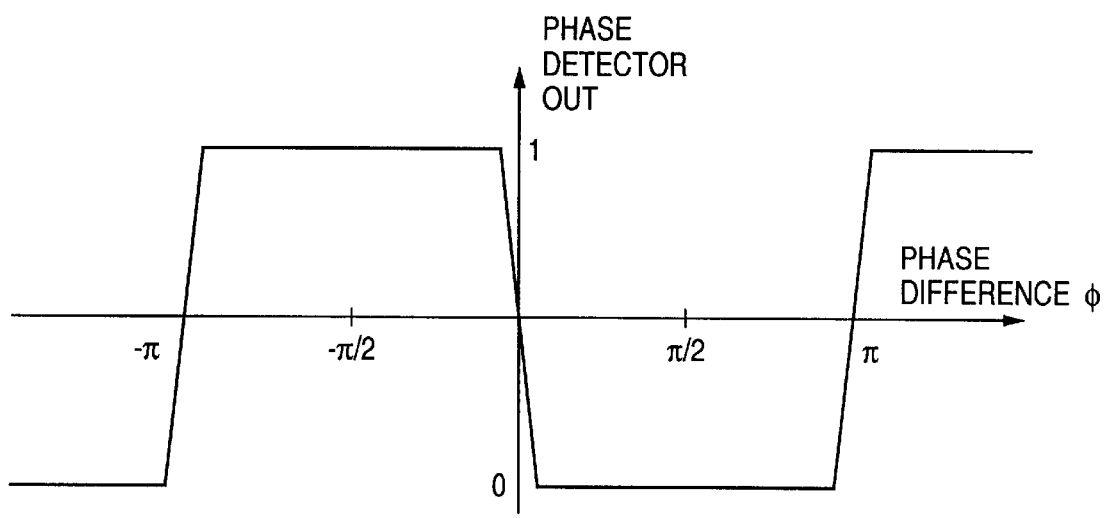
FIG. 15 is a chart to show the characteristic of a phase comparison circuit in the related art.
Figure 16:
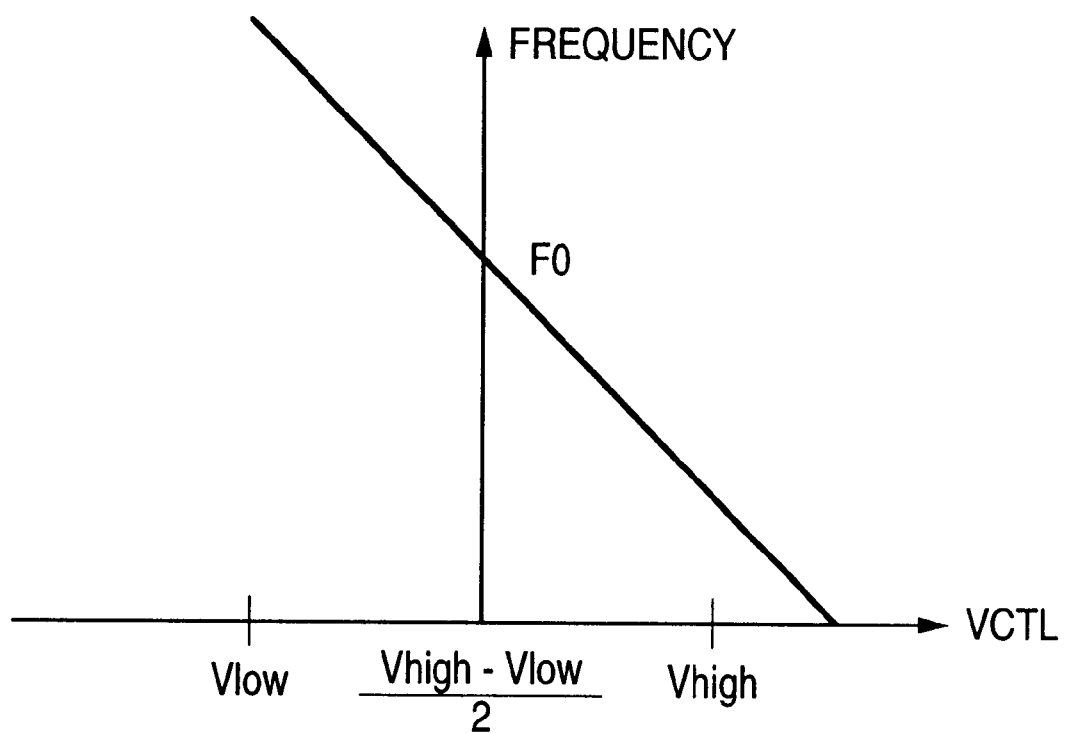
FIG. 16 is a chart to show the control voltage vs oscillation frequency characteristic of a voltage-controlled oscillation circuit in the related art.

In the phase synchronization means 1 of the clock reproduction and identification apparatus in the related art previously described with reference to FIG. 14, the oscillation frequency of the VCO 4 is changed with output of the integration circuit 3 as control voltage for controlling so that the input data change point matches the falling timing of the identification clock. As compared with the phase synchronization means 1 of the clock reproduction and identification apparatus in the related art shown in FIG. 14, the data delay device 10 in FIG. 5 has a configuration wherein the VCO 4 in FIG. 14 is replaced with a variable delay circuit 12, which is a variable delay circuit having a delay amount varied depending on control voltage. In the data delay device 10 in FIG. 5, the delay amount of the variable delay circuit 12 is changed with output of the integration circuit 14 as control voltage for controlling so that the input data change point matches the falling timing of the identification clock. The timing charts are the same as those in FIGS. 17A to 17C.

Figure 18A:
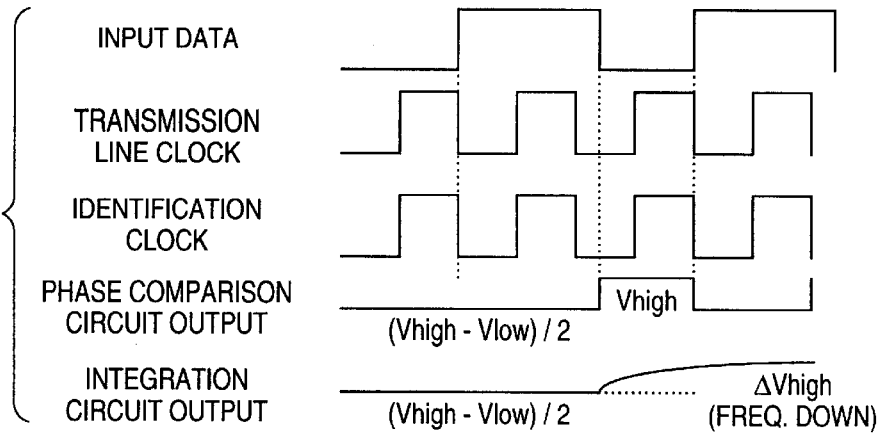
FIGS. 18A to 18C are timing charts of phase synchronization means when input data contains distortion in the related art.
Figure 18B:
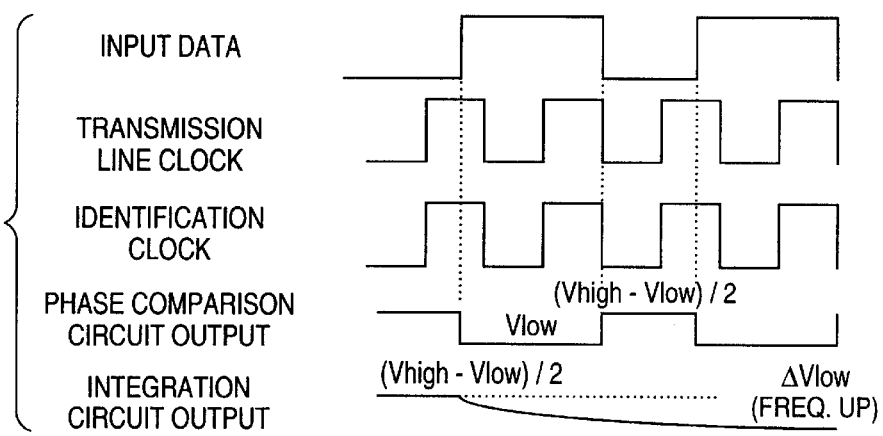
Figure 18C:
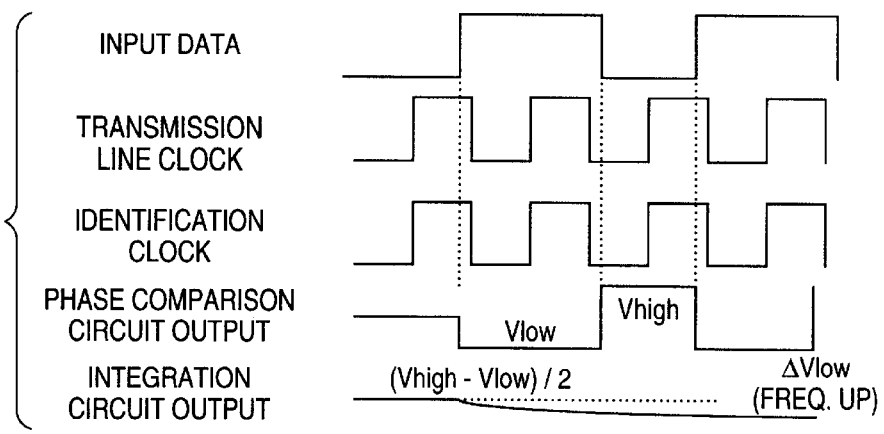

Since the phase comparison circuit 13 makes a phase comparison between the input data and the identification clock, an unstable phase transition as previously described with reference to FIG. 18 occurs if the input data contains distortion. The phase synchronization means 1 of the clock reproduction and identification apparatus in the related art controls the identification clock phase so that the input data change point matches the falling timing of the identification clock, the phase transition results in jitter in the identification clock and the identified data signal. However, in the configuration in FIG. 5, the delay amount of the input data is controlled and the identification clock matches a transmission line clock in phase, thus there is no increase in jitter in the identification clock and the identified data signal caused by the phase transition. If the identification device 9 has a sufficient phase margin, an identification error caused by the phase transition does not occur.

Clock extraction means 6 and phase synchronization means 1 are the same as that previously described with reference to FIGS. 1 to 3 in configuration and operation. Therefore, if input data contains distortion, the clock reproduction and identification apparatus in FIG. 5 synchronizes the phase of the identification clock with that of the transmission line clock with no distortion, so that a stable phase synchronization state with no jitter can be provided. If the input data containing the same long continuous code is received, a frequency tuner 8 continues to output the transmission line clock, so that phase synchronization can be held. Further, the delay time of the input data is automatically controlled so that the input data change point matches the falling timing of the identification clock, thus eliminating the need for setting the data delay device 10 in the first embodiment shown in FIG. 1.

Fourth Embodiment

Figure 6:
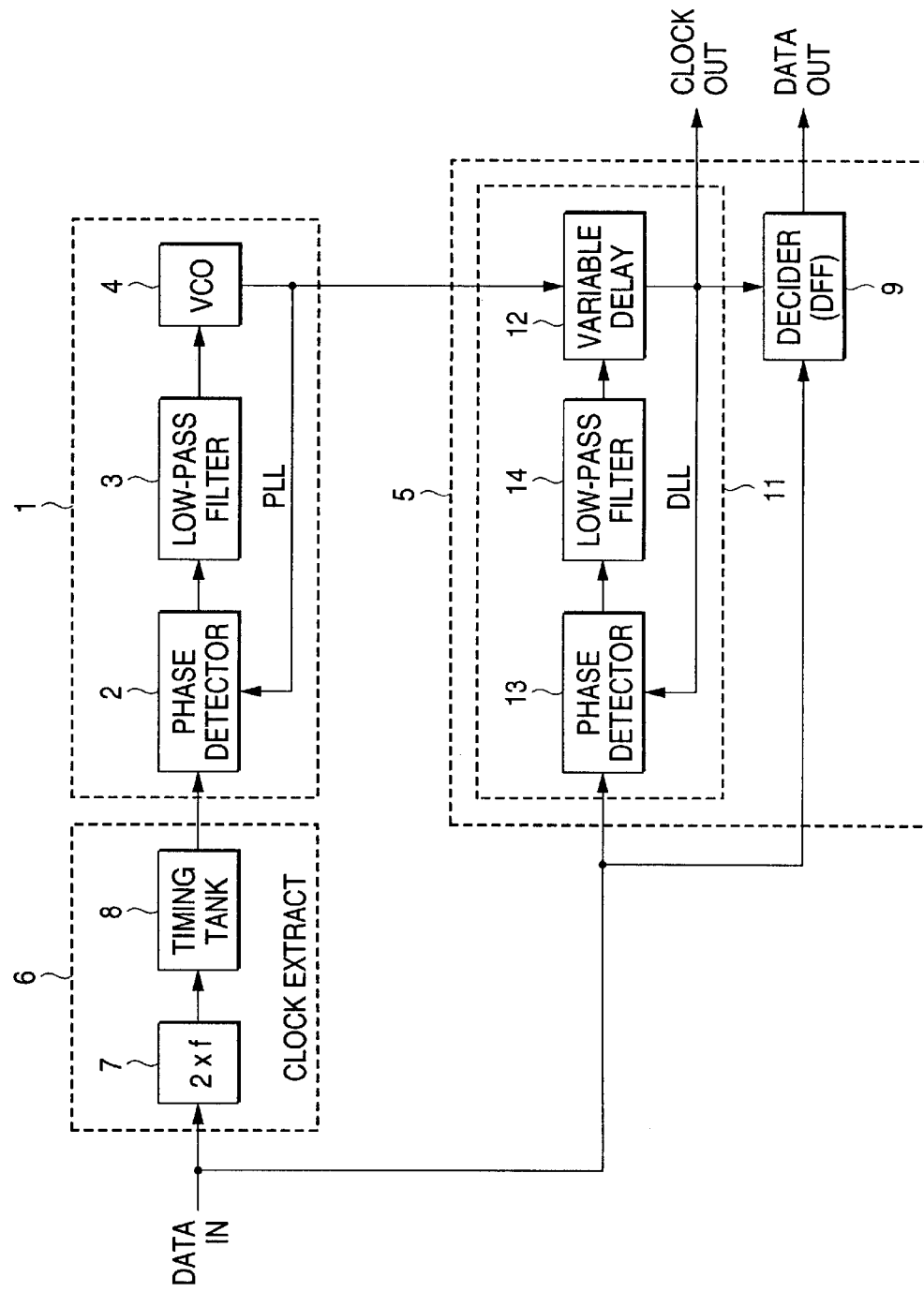
FIG. 6 is a block diagram of a clock reproduction and identification apparatus according to a fourth embodiment of the invention.

FIG. 6 is a block diagram of a clock reproduction and identification apparatus according to a fourth embodiment of the invention.

The clock reproduction and identification apparatus in FIG. 6 differs from that in FIG. 4 in that a clock delay device 11 is made up of a variable delay circuit 12, a phase comparison circuit 13, and an integration circuit 14. The clock delay device 11 in FIG. 4 involves a fixed delay device having the delay time in the clock extraction means 6. The clock delay device 11 in FIG. 6 is provided for automatically controlling the delay time of an identification clock so that the change point of input data to an identification device 9 matches the falling timing of the identification clock.

The operation of the clock delay device 11 in FIG. 6 is similar to that of the data delay device 10 previously described with reference to FIG. 5 except that the variable delay circuit 12 gives a delay to the identification clock. In the configuration in FIG. 6, the identification clock phase is controlled so that the input data change point matches the falling timing of the identification clock, thus an unstable phase transition as previously described with reference to FIG. 18 results in jitter in the identification clock and the identified data signal. However, the clock delay device 11 in FIG. 6 is provided for automatic control for eliminating the need for setting the delay amount in the clock delay device 11 in FIG. 4 and the response speed of the clock delay device 11 in FIG. 6 may be sufficiently slow as compared with the response time of the phase synchronization means 1 of the clock reproduction and identification apparatus in the related art previously described with reference to FIG. 14. Therefore, as the response speed of the clock delay device 11 is slowed down, the jitter in the identification clock and the identified data signal is lessened. If the identification device 9 has a sufficient phase margin, an identification error caused by the phase transition does not occur.

As explained in the description of the second embodiment, the clock delay device 11 may have a flat passage characteristic in a frequency range in the proximity of the transmission line clock, facilitating the circuit configuration as compared with the third embodiment using the data delay device 10.

Clock extraction means 6 and phase synchronization means 1 are the same as that previously described with reference to FIGS. 1 to 3 in configuration and operation. Therefore, if input data contains distortion, the clock reproduction and identification apparatus in FIG. 6 synchronizes the phase of the identification clock with that of the transmission line clock with no distortion, so that a stable phase synchronization state with no jitter can be provided. If the input data containing the same long continuous code is received, a frequency tuner 8 continues to output the transmission line clock, so that phase synchronization can be held. Further, the delay time of the identification clock is automatically controlled so that the input data change point matches the falling timing of the identification clock, thus eliminating the need for setting the clock delay device 11 in the first embodiment shown in FIG. 4.

Fifth Embodiment

In the third embodiment shown in FIG. 5, if the operation of the phase synchronization means 1 and the data delay device 10 converges, the output signal phases of the frequency tuner 8, the VCO 4, and the variable delay circuit 12 match. That is, the delay time of the variable delay circuit 12 is controlled so as to become the same as the signal delay time in the clock extraction means 6.

The delay variable width of the variable delay circuit 12 required for the data delay device 10 to converge needs to be set equal to or more than the signal delay time in the clock extraction means 6. In the actual clock reproduction and identification apparatus, the delay times of the clock extraction means 6 and the variable delay circuit 12 caused by temperature change and the signal wiring length are added and the delay variable width of the variable delay circuit 12 for the data delay device 10 to converge is furthermore increased.

If the delay variable width of the variable delay circuit 12 becomes equal to or more than one cycle of the transmission line clock, two points having the phase difference corresponding to one cycle of the transmission line clock may exist as convergence phase points of the data delay device 10. In this case, the data delay device 10 becomes a bistable control loop and the convergence operation becomes unstable.

Figure 7:
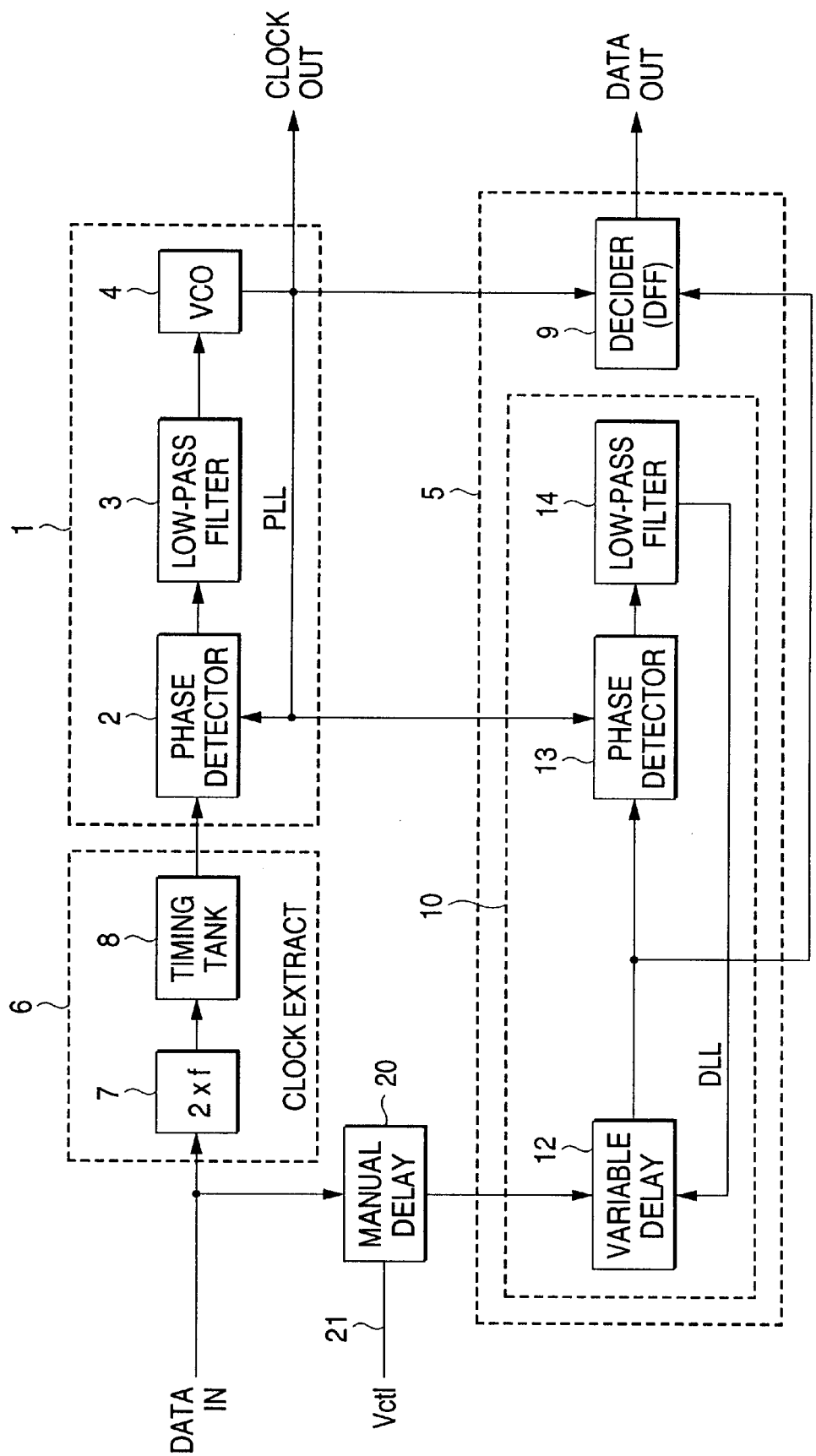
FIG. 7 is a block diagram of a clock reproduction and identification apparatus to show a fifth embodiment of the invention.

FIG. 7 is a block diagram of a clock reproduction and identification apparatus to show a fifth embodiment of the invention.

The clock reproduction and identification apparatus in FIG. 7 differs from that in FIG. 5 in that input data is input via a second variable delay circuit 20 to a variable delay circuit 12. The delay time of the second variable delay circuit 20 is determined by a signal given to a delay control terminal 21.

Figure 8:
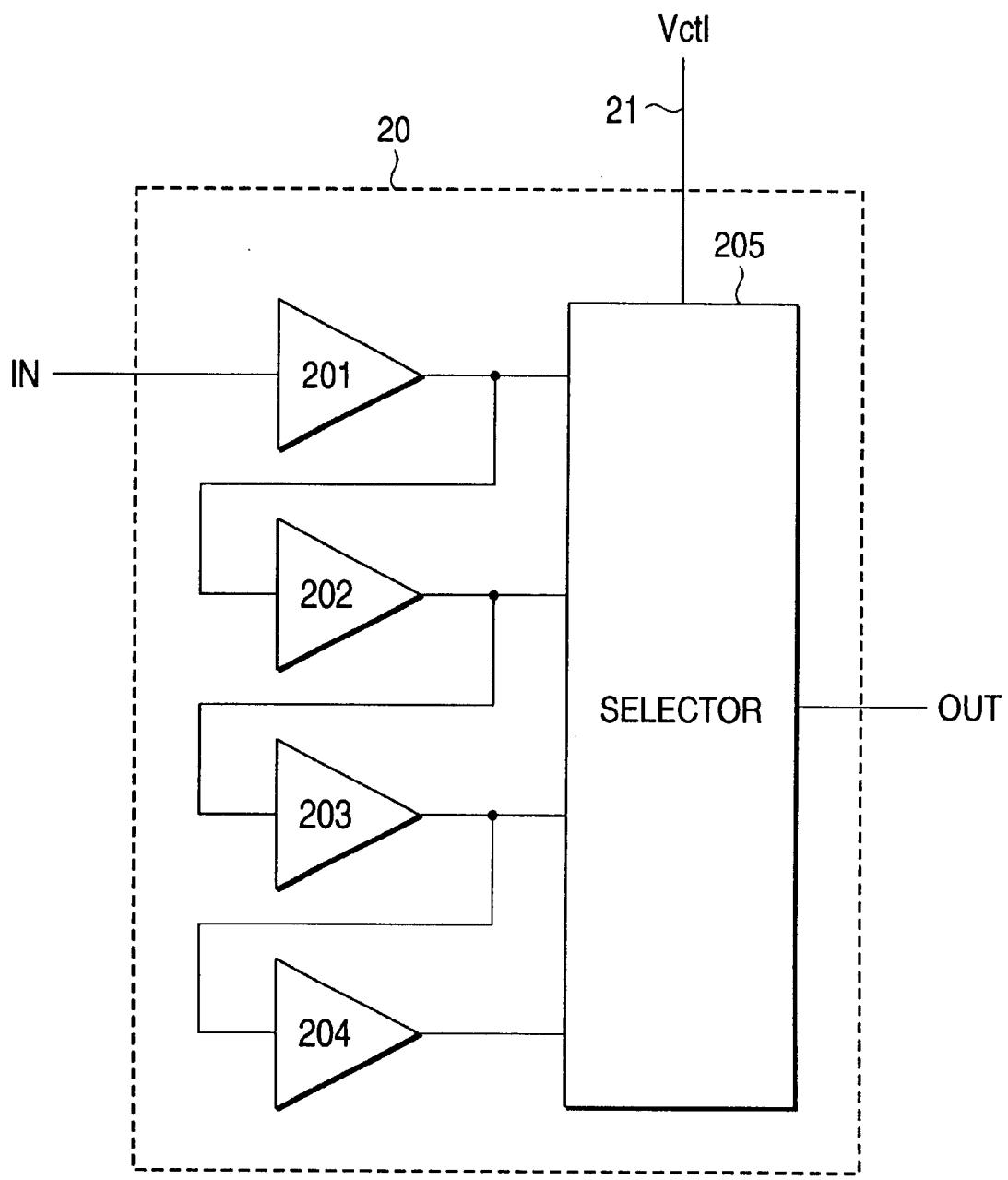
FIG. 8 is a block diagram to show a specific example of a second variable delay circuit 20 in the fifth embodiment of the invention.

FIG. 8 is a block diagram to show a specific example of the second variable delay circuit 20.

In the figure, numerals 201 to 204 denote delay gates and numeral 205 is a selector. An input signal is input through the delay circuit 201 to the selector 205. The delay gates 201 to 204 are cascaded and output of each delay gate is input to the selector 205. The selector 205 selects output of any of the delay gates 201 to 204 based on the control signal 21 and outputs the selected gate output.

The delay amount of each of the delay gates 201 to 204 is preset to one quarter the cycle of a transmission line clock. Therefore, the selector 205 can select an out-of-phase signal every quarter the cycle of the transmission line clock based on the control signal 21 and output the selected signal.

The signal given to the delay control terminal 21 is given so that the delay variable width of the variable delay circuit 12 required for a data delay device 10 to converge becomes equal to or less than one cycle of the transmission line clock. For example, the signal delay time in clock extraction means 6 and the delay time caused by the signal wiring length can be predicted and the delay time of the second variable delay circuit 20 can be set equal to the sum of the signal delay time in the clock extraction means 6 and the delay time caused by the signal wiring length. In this case, the delay variable width of the variable delay circuit 12 may include the temperature change components of the delay times of the second variable delay circuit 20, the clock extraction means 6, and the variable delay circuit 12.

Thus, in the fifth embodiment, the fixed delay time is assigned to the second variable delay circuit 20 even under the delay condition that the delay variable width equal to or more than one cycle of the transmission line clock is required for the variable delay circuit 12 such that the data delay device 10 becomes a bistable control loop, whereby the delay variable width of the variable delay circuit 12 becomes within one cycle of the transmission line clock and the convergence operation becomes stable.

In the description of the example, the second variable delay circuit 20 has the configuration shown in FIG. 8, but a variable delay circuit of another configuration for outputting a signal different in phase depending on the control signal may be adopted.

Further, in the description of the example, the input data is input via the second variable delay circuit 20 to the variable delay circuit 12, but the input data may be input to the variable delay circuit 12 and an output signal of the variable delay circuit 12 may be input to the second variable delay circuit 20; similar advantages to those in the example can be provided.

Sixth Embodiment

Figure 9:
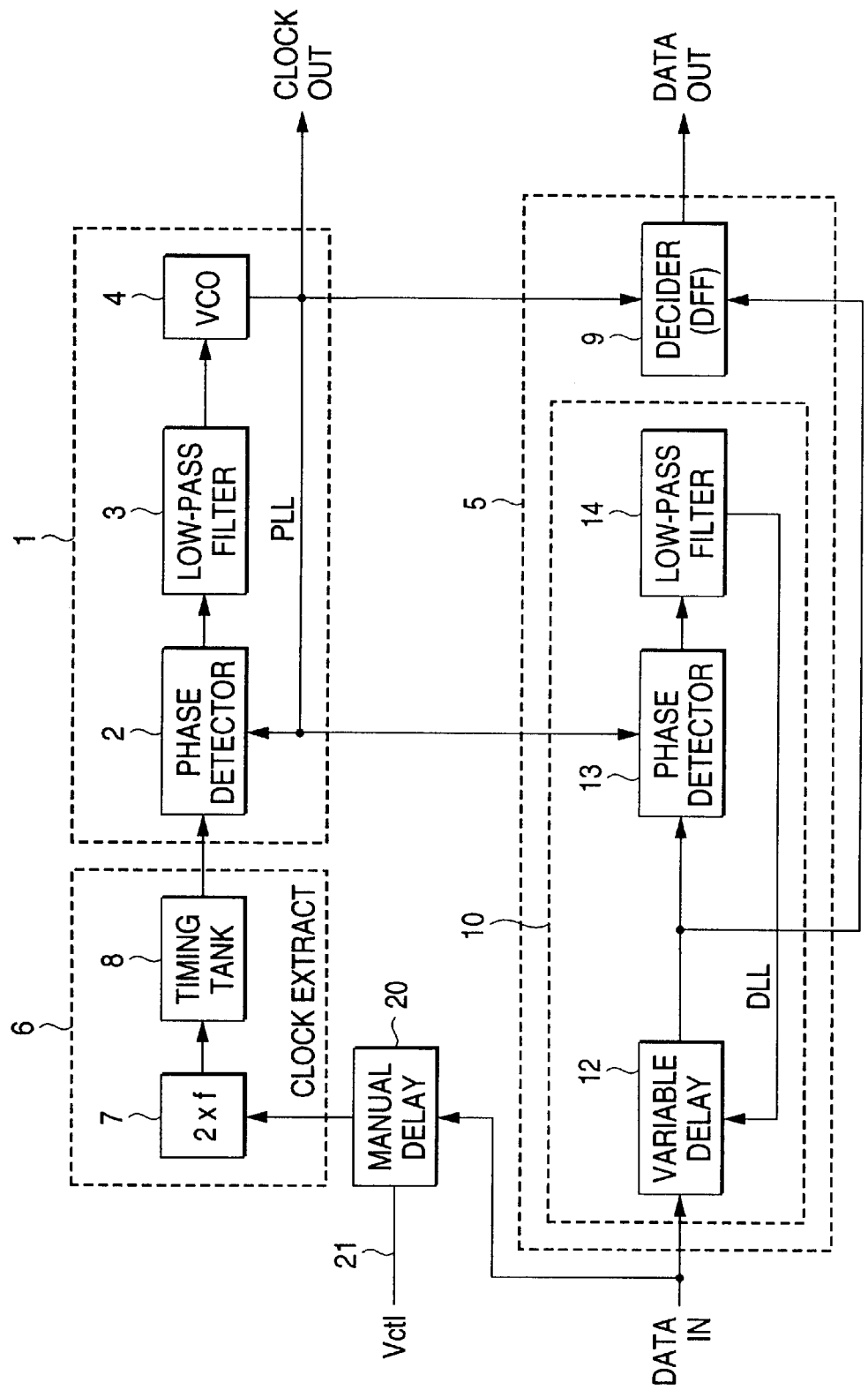
FIG. 9 is a block diagram of a clock reproduction and identification apparatus to show a sixth embodiment of the invention.

FIG. 9 is a block diagram of a clock reproduction and identification apparatus to show a sixth embodiment of the invention.

The clock reproduction and identification apparatus in FIG. 9 differs from that in FIG. 5 in that input data is input via a second variable delay circuit 20 to clock extraction means 6. The delay time of the second variable delay circuit 20 is determined by a signal given to a delay control terminal 21. The specific operation of the second variable delay circuit 20 is similar to that in the fifth embodiment.

In the sixth embodiment, as the phase of a transmission line clock output from the clock extraction means 6, the delay time of the second variable delay circuit 20 is added in addition to the delay time in the clock extraction means 6 and the delay time caused by the signal wiring length. Therefore, if the delay time of the second variable delay circuit 20 is set so that the phase difference between input data and the transmission line clock becomes one cycle of the transmission line clock, the delay variable width of a variable delay circuit 12 required for a data delay device 10 to converge may include the temperature change components of the delay times of the second variable delay circuit 20, the clock extraction means 6, and the variable delay circuit 12.

The fixed delay time is assigned to the second variable delay circuit 20 under the delay condition that the delay variable width equal to or more than one cycle of the transmission line clock is required for the variable delay circuit 12 such that the data delay device 10 becomes a bistable control loop, whereby the delay variable width of the variable delay circuit 12 is suppressed within one cycle of the transmission line clock, as in the fifth embodiment.

Thus, in the sixth embodiment, the convergence operation becomes stable even under the delay condition that the delay variable width equal to or more than one cycle of the transmission line clock is required for the variable delay circuit 12.

In the description of the example, the second variable delay circuit 20 has the configuration shown in FIG. 8, but a variable delay circuit of another configuration for outputting a signal different in phase depending on the control signal may be adopted.

Further, in the description of the example, the input data is input via the second variable delay circuit 20 to the clock extraction means 6, but the input data may be input to the clock extraction means 6 and an output signal of the clock extraction means 6 may be input to the second variable delay circuit 20; similar advantages to those in the example can be provided.

Seventh Embodiment

Figure 10:
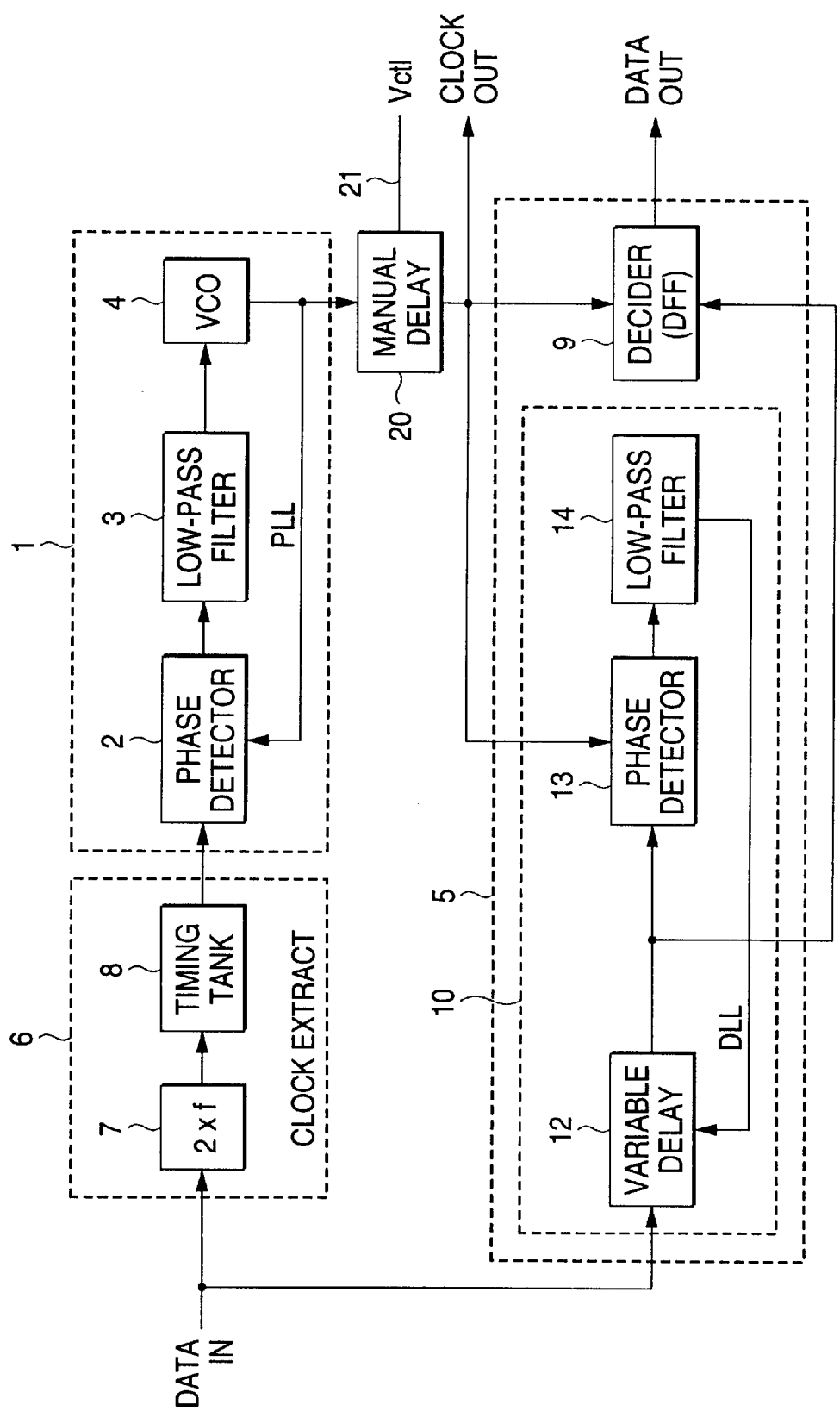
FIG. 10 is a block diagram of a clock reproduction and identification apparatus to show a seventh embodiment of the invention.

FIG. 10 is a block diagram of a clock reproduction and identification apparatus to show a seventh embodiment of the invention. The clock reproduction and identification apparatus in FIG. 10 differs from that in FIG. 5 in that an output signal of a VCO 4 is input via a second variable delay circuit 20 to an identification device 9. The delay time of the second variable delay circuit 20 is determined by a signal given to a delay control terminal 21. The specific operation of the second variable delay circuit 20 is similar to that in the fifth embodiment.

In the seventh embodiment, if the operation of phase synchronization means 1 and a data delay device 10 converges, the output signal phases of a frequency tuner 8 and the VCO 4 match. The output signal phases of a variable delay circuit 12 and the second variable delay circuit 20 match.

That is, as the delay variable width of the variable delay circuit 12 required for the data delay device 10 to converge, the delay time of the second variable delay circuit 20 is added to the delay time in clock extraction means 6 and the delay time caused by the signal wiring length. Therefore, if the delay time of the second variable delay circuit 20 is set so that the phase difference between input data and output of the second variable delay circuit 20 becomes one cycle of transmission line clock, the delay variable width of the variable delay circuit 12 required for the data delay device 10 to converge may include the temperature change components of the delay times of the second variable delay circuit 20, the clock extraction means 6, and the variable delay circuit 12.

The fixed delay time is assigned to the second variable delay circuit 20 under the delay condition that the delay variable width equal to or more than one cycle of the transmission line clock is required for the variable delay circuit 12 such that the data delay device 10 becomes a bistable control loop, whereby the delay variable width of the variable delay circuit 12 is suppressed within one cycle of the transmission line clock, as in the fifth embodiment.

Thus, in the seventh embodiment, the convergence operation becomes stable even under the delay condition that the delay variable width equal to or more than one cycle of the transmission line clock is required for the variable delay circuit 12.

In the description of the example, the second variable delay circuit 20 has the configuration shown in FIG. 8, but a variable delay circuit of another configuration for outputting a signal different in phase depending on the control signal may be adopted.

Further, in the description of the example, the output signal of the VCO 4 is input via the second variable delay circuit 20 to the identification device 9, but the output signal of the VCO 4 may be input to the identification device 9 and the output signal of the VCO 4 may be input via the second variable delay circuit 20 to a phase comparison circuit 2; similar advantages to those in the example can be provided.

Eighth Embodiment

In the fourth embodiment shown in FIG. 6, if the operation of the phase synchronization means 1 and the clock delay device 11 converges, the output signal phases of the frequency tuner 8 and the VCO 4 match. The output signal phases of input data and the variable delay circuit 12 match. That is, control is performed so that the sum of the delay time of the variable delay circuit 12 and the signal delay time in the clock extraction means 6 becomes one cycle of the transmission line clock.

If the delay variable width of the variable delay circuit 12 becomes equal to or more than one cycle of the transmission line clock, two points having the phase difference corresponding to one cycle of the transmission line clock may exist as convergence phase points of the clock delay device 11. In this case, the clock data delay device 11 becomes a bistable control loop and the convergence operation becomes unstable, as in the third embodiment.

Figure 11:
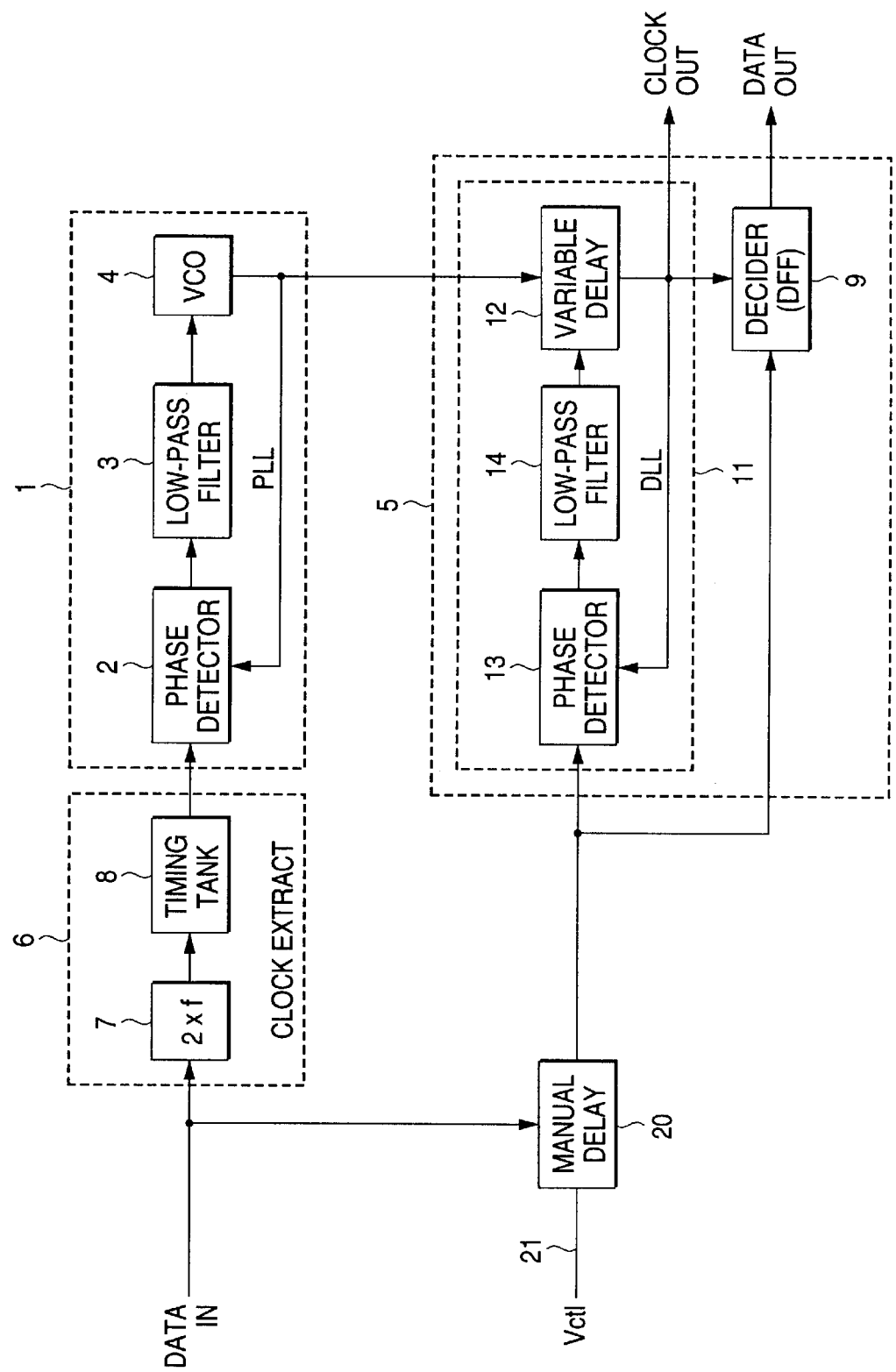
FIG. 11 is a block diagram of a clock reproduction and identification apparatus to show an eighth embodiment of the invention.

FIG. 11 is a block diagram of a clock reproduction and identification apparatus to show an eighth embodiment. The clock reproduction and identification apparatus in FIG. 11 differs from that in FIG. 6 in that input data is input via a second variable delay circuit 20 to a phase comparison circuit 13. The delay time of the second variable delay circuit 20 is determined by a signal given to a delay control terminal 21. The specific operation of the second variable delay circuit 20 is similar to that in the fifth embodiment.

The signal given to the delay control terminal 21 is given so that the delay variable width of the variable delay circuit 12 required for a clock delay device 11 to converge becomes equal to or less than one cycle of the transmission line clock. That is, if the delay time of the second variable delay circuit 20 can be set equal to the signal delay time in clock extraction means 6 added to the delay time caused by the signal wiring length, the delay variable width of the variable delay circuit 12 may include the temperature change components of the delay times of the second variable delay circuit 20, the clock extraction means 6, and the variable delay circuit 12.

Thus, in the eighth embodiment, the fixed delay time is assigned to the second variable delay circuit 20 even under the delay condition that the delay variable width equal to or more than one cycle of the transmission line clock is required for the variable delay circuit 12 such that the clock delay device 11 becomes a bistable control loop, whereby the delay variable width of the variable delay circuit 12 becomes within one cycle of the transmission line clock and the convergence operation becomes stable.

In the description of the example, the second variable delay circuit 20 has the configuration shown in FIG. 8, but a variable delay circuit of another configuration for outputting a signal different in phase depending on the control signal may be adopted.

Ninth Embodiment

Figure 12:
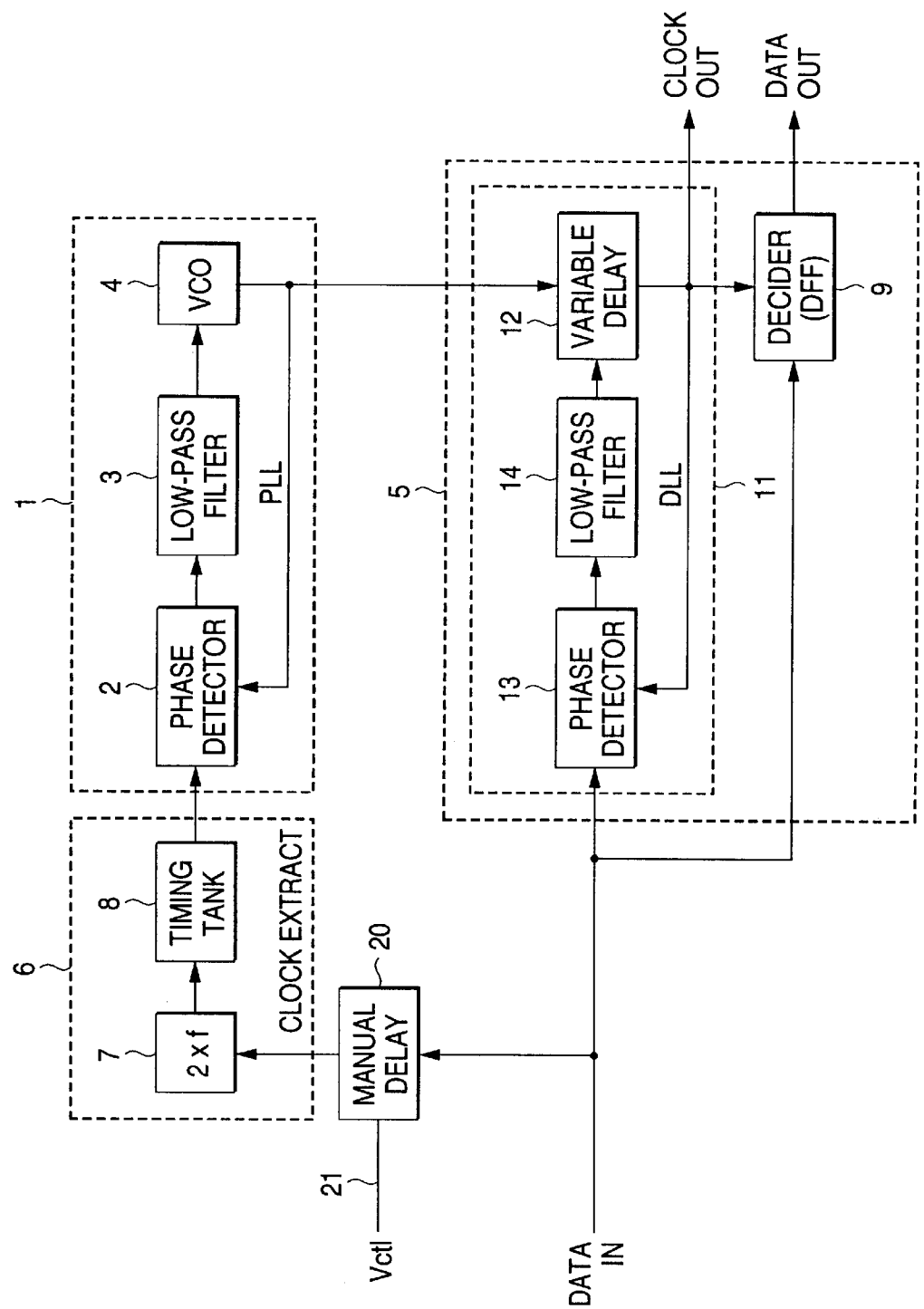
FIG. 12 is a block diagram of a clock reproduction and identification apparatus to show a ninth embodiment of the invention.

FIG. 12 is a block diagram of a clock reproduction and identification apparatus to show a ninth embodiment of the invention. The clock reproduction and identification apparatus in FIG. 12 differs from that in FIG. 6 in that input data is input via a second variable delay circuit 20 to clock extraction means 6. The delay time of the second variable delay circuit 20 is determined by a signal given to a delay control terminal 21. The specific operation of the second variable delay circuit 20 is similar to that in the fifth embodiment.

In the ninth embodiment, as the phase of a transmission line clock output from the clock extraction means 6, the delay time of the second variable delay circuit 20 is added in addition to the delay time in the clock extraction means 6 and the delay time caused by the signal wiring length. Therefore, if the delay time of the second variable delay circuit 20 is set so that the phase difference between input data and the transmission line clock becomes one cycle of the transmission line clock, the delay variable width of a variable delay circuit 12 required for a clock delay device 11 to converge may include the temperature change components of the delay times of the second variable delay circuit 20, the clock extraction means 6, and the variable delay circuit 12.

The fixed delay time is assigned to the second variable delay circuit 20 under the delay condition that the delay variable width equal to or more than one cycle of the transmission line clock is required for the variable delay circuit 12 such that the clock delay device 11 becomes a bistable control loop, whereby the delay variable width of the variable delay circuit 12 is suppressed within one cycle of the transmission line clock, as in the fifth embodiment.

Thus, in the ninth embodiment, the convergence operation becomes stable even under the delay condition that the delay variable width equal to or more than one cycle of the transmission line clock is required for the variable delay circuit 12.

In the description of the example given above, the second variable delay circuit 20 has the configuration shown in FIG. 8, but a variable delay circuit of another configuration for outputting a signal different in phase depending on the control signal may be adopted.

Further, in the description of the example given above, the input data is input via the second variable delay circuit 20 to the clock extraction means 6, but the input data may be input to the clock extraction means 6 and an output signal of the clock extraction means 6 may be input to the second variable delay circuit 20; similar advantages to those in the example can be provided.

Tenth Embodiment

Figure 13:
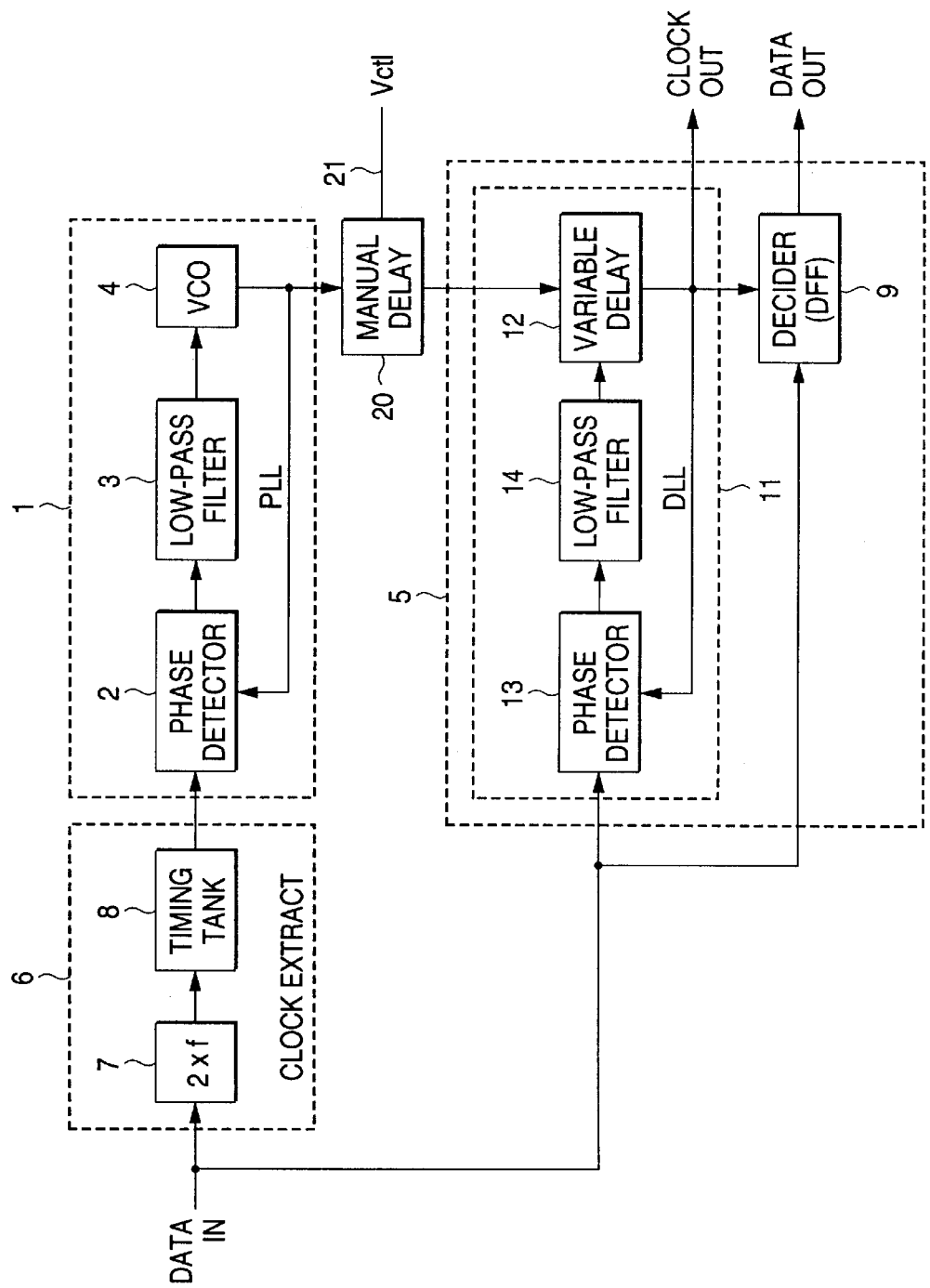
FIG. 13 is a block diagram of a clock reproduction and identification apparatus to show a tenth embodiment of the invention.

FIG. 13 is a block diagram of a clock reproduction and identification apparatus to show a tenth embodiment of the invention. The clock reproduction and identification apparatus in FIG. 13 differs from that in FIG. 6 in that an output signal of a VCO 4 is input via a second variable delay circuit 20 to a variable delay circuit 12. The delay time of the second variable delay circuit 20 is determined by a signal given to a delay control terminal 21. The specific operation of the second variable delay circuit 20 is similar to that in the fifth embodiment.

In the tenth embodiment, if the operation of phase synchronization means 1 and a clock delay device 11 converges, the output signal phases of a frequency tuner 8 and the VCO 4 match. The output signal phases of input data and the variable delay circuit 12 match.

That is, as the delay variable width of the variable delay circuit 12 required for the clock delay device 11 to converge, the delay time of the second variable delay circuit 20 is added to the delay time in clock extraction means 6 and the delay time caused by the signal wiring length. Therefore, if the delay time of the second variable delay circuit 20 is set so that the phase difference between input data and output of the second variable delay circuit 20 becomes one cycle of transmission line clock, the delay variable width of the variable delay circuit 12 required for the clock delay device 11 to converge may include the temperature change components of the delay times of the second variable delay circuit 20, the clock extraction means 6, and the variable delay circuit 12.

The fixed delay time is assigned to the second variable delay circuit 20 under the delay condition that the delay variable width equal to or more than one cycle of the transmission line clock is required for the variable delay circuit 12 such that the clock delay device 11 becomes a bistable control loop, whereby the delay variable width of the variable delay circuit 12 is suppressed within one cycle of the transmission line clock, as in the fifth embodiment.

Thus, in the tenth embodiment, the convergence operation becomes stable even under the delay condition that the delay variable width equal to or more than one cycle of the transmission line clock is required for the variable delay circuit 12.

In the description of the example given above, the second variable delay circuit 20 has the configuration shown in FIG. 8, but a variable delay circuit of another configuration for outputting a signal different in phase depending on the control signal may be adopted.

Further, in the embodiment, the output signal of the VCO 4 is input via the second variable delay circuit 20 to the variable delay circuit 12, but the output signal of the VCO 4 may be input to the variable delay circuit 12 and the output signal of the VCO 4 may be input via the second variable delay circuit 20 to a phase comparison circuit 2; similar advantages to those in the embodiment can be provided.

Further, in the description of the example given above, the output signal of the VCO 4 is input via the second variable delay circuit 20 to the variable delay circuit 12, but the output signal of the VCO 4 may be input to the variable delay circuit 12 and the output signal of the variable delay circuit 12 may be input via the second variable delay circuit 20 to a phase comparison circuit 13 and an identification device 9; similar advantages to those in the example can be provided.

What is claimed is:

1. A clock reproduction and identification apparatus comprising:

clock extraction means for extracting a transmission line clock from input data;

phase synchronization means for reproducing an identification clock synchronized with the transmission line clock in frequency and phase; and identification means for identifying the input data based on the identification clock, wherein said identification means comprises a data delay device for giving a defined delay time to the input data and an identification device for identifying output of the data delay device based on the identification clock.

2. The clock reproduction and identification apparatus as claimed in claim 1, wherein said clock extraction means comprises a change point detector for detecting a change point of the input data and a frequency tuner having a passage characteristic in a predetermined frequency band for extracting the transmission line clock.

3. The clock reproduction and identification apparatus as claimed in claim 1 wherein said identification means comprises a clock delay device for giving a defined delay time to the identification clock and an identification device for identifying the input data based on output of the clock delay device.

4. The clock reproduction and identification apparatus as claimed in claim 1 wherein the data delay device comprises:

a variable delay circuit for giving a delay time defined by a control signal;

a phase comparison circuit for giving a phase difference signal responsive to a phase difference between output of the variable delay circuit and the identification clock; and an integration circuit for integrating output of the phase comparison circuit for providing the control signal.

5. The clock reproduction and identification apparatus as claimed in claim 3 wherein the clock delay device comprises:

a variable delay circuit for giving a delay time defined by a control signal;

a phase comparison circuit for giving a phase difference signal responsive to a phase difference between output of the variable delay circuit and the input data; and an integration circuit for integrating output of the phase comparison circuit for providing the control signal.

6. The clock reproduction and identification apparatus as claimed in claim 4 further including a second variable delay circuit for giving a delay time defined by a control signal, wherein the input data is given via the second variable delay circuit to the variable delay circuit.

7. The clock reproduction and identification apparatus as claimed in claim 4 further including a second variable delay circuit for giving a delay time defined by a control signal, wherein the input data is given via the second variable delay circuit to said clock extraction means.

8. The clock reproduction and identification apparatus as claimed in claim 4 further including a second variable delay circuit for giving a delay time defined by a control signal, wherein the identification clock is given via the second variable delay circuit to said identification means.

9. The clock reproduction and identification apparatus as claimed in claim 5 further including a second variable delay circuit for giving a delay time defined by a control signal, wherein the input data is given via the second variable delay circuit to the variable delay circuit.

10. The clock reproduction and identification apparatus as claimed in claim 5 further including a second variable delay circuit for giving a delay time-defined by a control signal, wherein the input data is given via the second variable delay circuit to said clock extraction means.

11. The clock reproduction and identification apparatus as claimed in claim 5 further including a second variable delay circuit for giving a delay time defined by a control signal, wherein the identification clock is given via the second variable delay circuit to said identification means.

12. A method for clock reproduction and identification comprising the steps of:

receiving input data from a transmission line;

extracting a transmission line clock from the input data;

reproducing an identification clock synchronized with the transmission line clock in frequency and phase; and identifying the input data based on the identification clock, wherein the identifying step includes delaying the input data for a defined time and identifying the delayed input data based on the identification clock.

13. The method for clock reproduction and identification according to claim 12, wherein the step of delaying the input data comprises:

applying the input data to a variable delay circuit, wherein the variable delay circuit gives the input data a delay time defined by a control signal;

determining a phase difference signal responsive to a phase difference between output of the variable delay circuit and the identification clock; and integrating the phase difference signal in order to provide the control signal.

14. The method for clock reproduction and identification according to claim 13, wherein the input data is applied to the variable delay circuit via a second variable delay circuit which gives a delay time defined by a control signal.

15. The method for clock reproduction and identification according to claim 13, wherein the clock is extracted from the input data after the input data is given a delay time by a second variable delay circuit whose delay time is defined by a control signal.

16. The method for clock reproduction and identification according to claim 13, wherein the extracted identification clock is given a delay time by a second variable delay circuit whose delay time is defined by a control signal, and the identifying step is based on the identification clock.

17. A method for clock reproduction and identification comprising the steps of:

receiving input data from a transmission line;

extracting a transmission line clock from the input data;

reproducing an identification clock synchronized with the transmission line clock in frequency and phase;

delaying the identification clock for a defined time by:
- a) applying the identification clock to a variable delay circuit, wherein the variable delay circuit gives the identification clock a delay time defined by a control signal;
- b) determining a phase difference signal responsive to a phase difference between output of the variable delay circuit and the identification clock; and
- c) integrating the phase difference signal in order to provide the control signal; and identifying the input data based on the delayed identification clock.

18. The method for clock reproduction and identification according to claim 17, wherein the input data is given a delay time by a second variable delay circuit whose delay time is defined by a control signal.

19. The method for clock reproduction and identification according to claim 17, wherein the clock is extracted from the input data after the input data is given a delay time by a second variable delay circuit whose delay time is defined by a control signal.

20. The method for clock reproduction and identification according to claim 17, wherein the identification clock is applied to the variable delay circuit via a second variable delay circuit which gives a delay time defined by a control signal.

* * * * *